United States Patent
Kagaya et al.

(10) Patent No.: US 7,167,494 B2
(45) Date of Patent: Jan. 23, 2007

(54) OPTICAL TRANSMISSION MODULE

(75) Inventors: Osamu Kagaya, Tokyo (JP); Hideyuki Kuwano, Fujisawa (JP); Kenji Yoshimoto, Yokohama (JP)

(73) Assignee: OpNext Japan, Inc., Yokohama (JP)

( * ) Notice: Subject to any disclaimer, the term of this patent is extended or adjusted under 35 U.S.C. 154(b) by 363 days.

(21) Appl. No.: 10/808,825

(22) Filed: Mar. 24, 2004

(65) Prior Publication Data
US 2005/0025202 A1    Feb. 3, 2005

(30) Foreign Application Priority Data
Jul. 30, 2003 (JP) ............... 2003-203592

(51) Int. Cl.
*H01S 3/00* (2006.01)
(52) U.S. Cl. ................... 372/38.02; 372/38.1
(58) Field of Classification Search ............. 372/38.02, 372/38.1, 38.01
See application file for complete search history.

(56) References Cited
U.S. PATENT DOCUMENTS
5,192,875 A * 3/1993 Kielmeyer, Jr. ............. 327/118
5,821,825 A * 10/1998 Kobayashi .................... 331/66
2004/0101007 A1 * 5/2004 Bozso et al. ............. 372/38.02

FOREIGN PATENT DOCUMENTS
JP     2002-374028     * 12/2002

* cited by examiner

*Primary Examiner*—Minsun Oh Harvey
*Assistant Examiner*—Tuan N. Nguyen
(74) *Attorney, Agent, or Firm*—Townsend and Townsend and Crew LLP

(57) ABSTRACT

The present invention provides an optical transmission module configured such that a driver IC chip to drive a semiconductor laser device, a first insulation plate having the semiconductor laser device mounted thereon and a coupling optical component are mounted in this order, a thin film inductor element and thin film resistor element which are connected in parallel are formed on a second insulation plate and a bias current is supplied to the semiconductor laser device via this LR element.

9 Claims, 6 Drawing Sheets

OPTICAL TRANSMISSION MODULE

The present application claims priority from Japanese application JP2003-203592 filed on Jul. 30, 2003, the content of which is hereby incorporated by reference into this application.

BACKGROUND OF THE INVENTION

The present invention relates to optical transmission modules for optical communication and, in particular, to an optical transmission module for use in the transmitter sections of 10 Gbits/s high transmission rate optical transceivers.

The semiconductor laser-used optical transmission module is one of the key devices of transceivers for optical fiber transmission. With the spread of broadband networks, optical transmission modules have recently so advanced in transmission speed that the bit rate of 10 Gbits/s is common. Optical transmission modules in this field of application are required to not only reduce the size, power consumption and cost but also realize good transmission waveform quality.

A prior art optical transmission module is discussed in, for example, Japanese Patent Laid-open No. 2002-374028. FIG. 6 shows a sub-mount plate having a semiconductor laser mounted thereon in the prior art optical transmission module. Its top view and front view are shown respectively in FIG. 6A and 6B. Reference numeral 1 denotes a semiconductor laser diode, 2 is an insulation plate made of ceramics, 3 is a ground electrode, 4 is a signal transmission line, 5 is a resistor element, 6 is a thin-film inductor, 7 is a bottom ground electrode and 8 is a reduced thickness formed below the thin film inductor. In this prior art example, the direct modulation type semiconductor laser diode 1 is mounted adjacent to the thin film inductor 6 on the same insulation plate 2 having the thin film inductor 6 mounted thereon and a bias current is supplied to the laser diode 1 via the thin film inductor 6. This configuration is intended to reduce the bonding wire inductance and the capacitance parasitic to the inductor so as to minimize the adverse effect on the high frequency signal. The signal transmission line 4 is formed as a grounded coplanar waveguide type transmission line having a ground electrode line formed along each side thereof and a bottom electrode 7 formed on the bottom of the plate 2. Usually, a voltage drive type driver IC is used externally. The series resistance of the resistor element 5 and semiconductor laser diode 1 and the characteristic impedance of the signal transmission line are matched to the output impedance (for example 50 Ω) of the driver IC so as to transfer the voltage signal of the driver IC to the semiconductor laser diode 1 without causing reflection of the voltage signal.

SUMMARY OF THE INVENTION

In the above-described prior art technique, a current drive type IC is used instead of a voltage drive type IC as the laser drive IC in order to lower the power consumption by eliminating the power consumed by the impedance matching resistor. However, eliminating the impedance matching resistor makes it difficult to maintain the quality of the transmission waveform.

In addition, to reduce the inductance between the semiconductor laser device and the driver IC, it is necessary to reduce the distance between them. In this prior art technique, however, the distance between the laser device and the driver IC cannot be reduced sufficiently due to the size of the thin film inductor since the thin film inductor and the semiconductor laser device are mounted on the same insulation plate.

In addition, although the capacitance parasitic to the thin film inductor is relatively small and therefore the resonant frequency caused by this parasitic capacitance and the bonding wire is sufficiently high in this prior art technique, the resonant frequency caused by the parasitic capacitance and the thin film inductor falls in the range of DC to 8 GHz which makes it impossible to attain satisfactory transmission waveform quality.

It is an object of the present invention to solve the above-mentioned problems, that is, to provide an optical transmission module superior in transmission waveform quality and power consumption.

It is also an object of the present invention to provide an optical transmission module suited ideally for 10 Gbits/s optical transmission transceivers.

To achieve these objects, according to a first aspect of the present invention, there is provided an optical transmission module characterized in that a bias current is supplied to a semiconductor laser device (laser diode device) via a thin film inductor element (such as a thin film spiral inductor element) and a thin film resistor element which are connected in parallel.

According to the present invention, the optical transmission module as described above is characterized in that a first insulation plate having the semiconductor laser device mounted thereon and a second insulation plate having the thin film inductor element and thin film resistor element formed thereon are respectively formed as separate insulation plates and an electrode formed on the first insulation plate is connected via a bonding wire or ribbon with one end pad of the thin film inductor element and thin film resistor element which are connected in parallel.

In addition, according the present invention, the optical transmission module as describe above is characterized in that a resonant frequency in a resonant circuit composed of the grounding capacitance of the thin film inductor element on the second insulation plate and an inductance of the bonding wire is not lower than 8 GHz.

According to the present invention, the optical transmission module as described above is characterized in that a driver IC chip to drive the semiconductor laser device is placed adjacent to the first insulation plate and a terminal of the driver IC chip is connected with an electrode on the first insulation plate by using bonding wires or ribbons.

According to the present invention, the optical transmission module as described above is characterized in that the driver IC chip is a current drive type.

In such a configuration as described so far, it is possible to reduce the capacitances parasitic to the thin film inductor element and thin film resistor element. Accordingly, the impedance of the bias circuit, viewed from the semiconductor laser device, can be designed so that its resonant frequency at which the bias circuit has a minimum impedance is lower than 8 GHz, as shown in FIG. 4. As a result, we could attain a good waveform as shown in FIG. 3 in which the mask margin amount indicating the quality of the optical waveform is substantially maximized.

In addition, as shown in FIG. 5, the amount of mask margin which indicates the quality of the optical waveform can be maximized by setting the conductance of the parallel resistor element to 4.4 mS or higher (225 Ω or lower in terms of resistance). As compared with the prior art method, the quality of the optical transmission waveform can be improved.

In addition, since the thin film inductor element 15 is formed on a separate insulation plate, it is advantageously possible to enlarge the size of the inductor element and therefore increase the current capacity and decrease the series resistance.

In addition, since the semiconductor laser diode device and the thin inductor element are respectively formed on separate plates, it is advantageously possible to not only improve the heat radiation from the laser diode element by thinning the first insulation plate but also at the same time reduce the capacitances parasitic to the inductor element by thickening the second insulation plate.

BRIEF DESCRIPTION OF THE DRAWINGS

FIG. 6 shows a semiconductor laser sub-mount plate in a prior art optical transmission module, where

DETAILED DESCRIPTION OF THE PREFERRED EMBODIMENTS

The following describes embodiments of the present invention with reference to the drawings.

Figure 1:
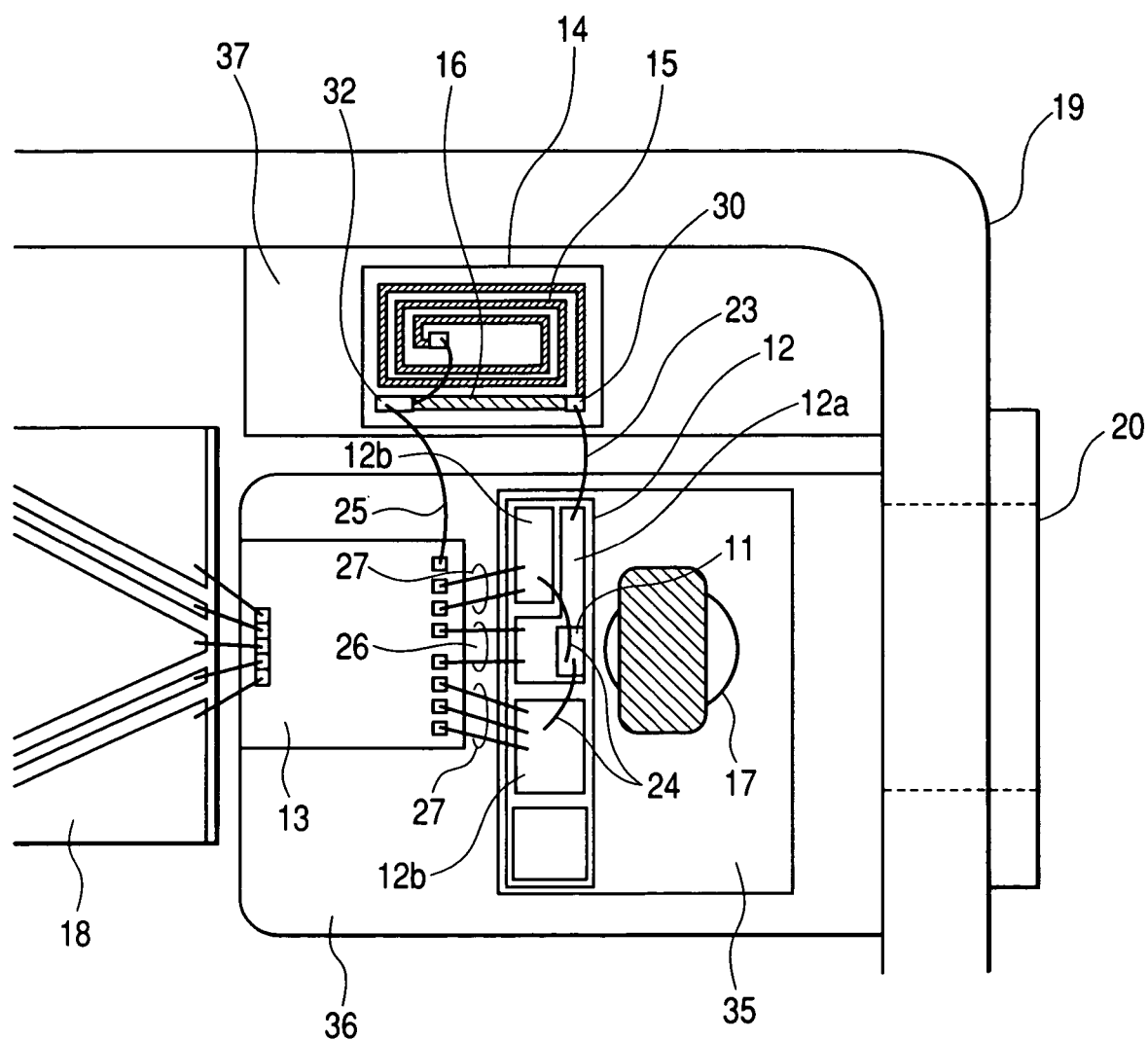
FIG. 1 is a schematic view showing major parts of an optical transmission module according to an embodiment of the present invention.
Figure 2:
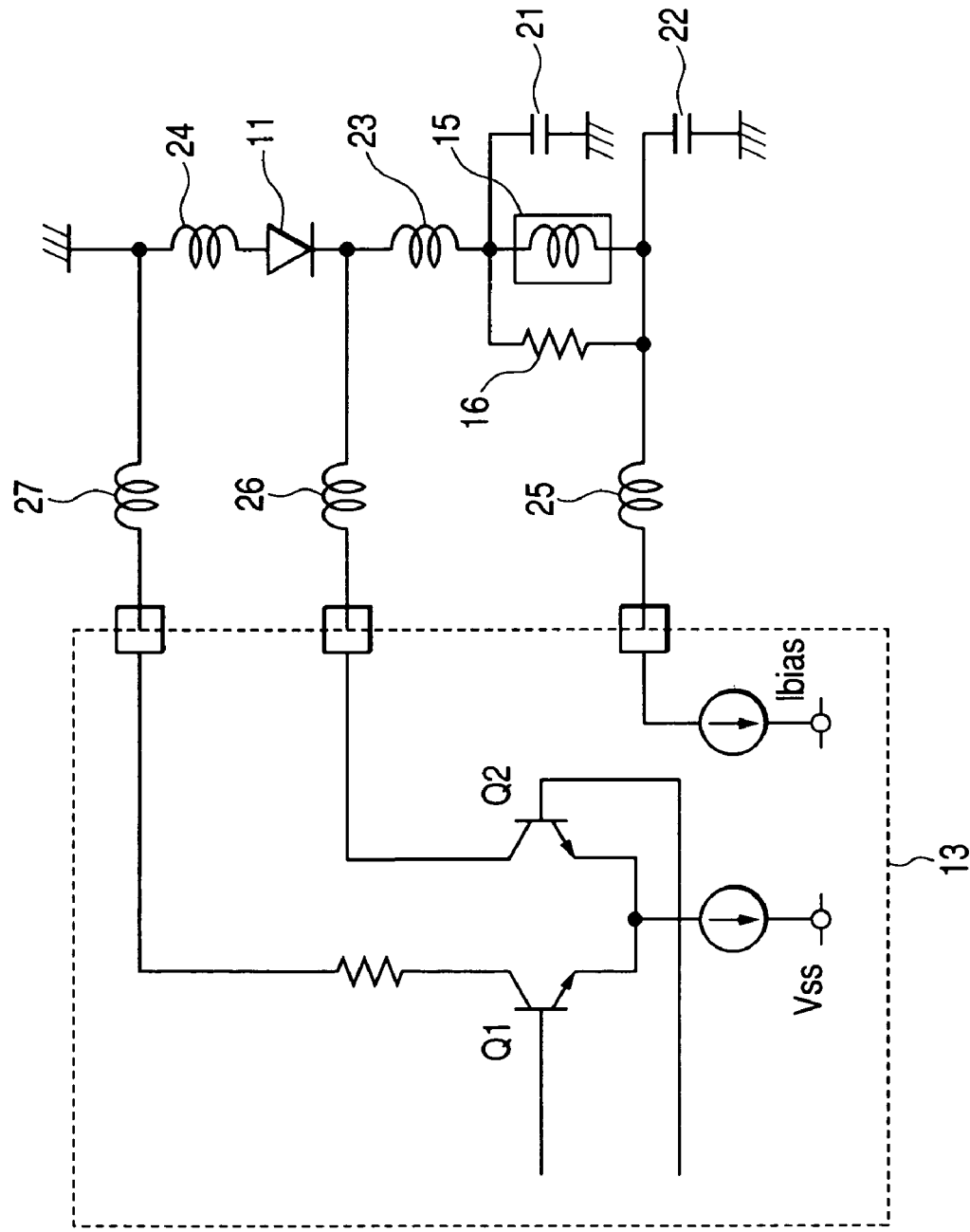
FIG. 2 is a general circuit diagram of the optical transmission module of the embodiment according to the present invention.

Firstly, an embodiment of an optical transmission module according to the present invention is described with reference to FIGS. 1 and 2. FIG. 1 is a schematic view showing major parts of the optical transmission module whereas FIG. 2 is a general circuit diagram of the optical transmission module.

Recently, optical transmission modules pertaining to the present invention are facing the demand for lower operation voltage (e.g., 3.3 V) and lower power consumption. Accordingly, the embodiment is configured to use a current drive type IC 13 as a laser drive IC so as to eliminate the impedance matching resistor or the power consumed by the impedance matching resistor. To allow this configuration using a current drive type laser drive IC such as the IC13 to maintain the quality of the transmission waveform at a transmission data rate of 10 Gbits/s, it is found essential to (1) reduce the inductance between the semiconductor laser device 11 and the drive IC 13 and (2) secure that the impedance characteristic, as viewed from the bias circuit (23, 15, 16, 21, 22 and 25), has no resonant frequency in the rage of DC to 8 GHz or no minimum impedance value in that frequency range.

In addition, it is practically impossible to reduce the size of the thin-film inductor 15 below 1 mm×1 mm in view of its current capacity and the voltage drop caused by its series resistance since the bias current to the semiconductor laser device 11 must be at least 50 to 100 mA to achieve a good transmission waveform.

Then, the optical transmission module according to the embodiment of the present invention is described below in more detail with reference to 1. Reference numeral 11 denotes a semiconductor laser device (laser diode device) as mentioned above. A fast, e.g., 10 Gbits/s electrical signal amplified in current by the current drive type driver IC 13 is converted to an optical signal by the semiconductor laser device 13 and emitted into an optical fiber via a coupler lens 17 or a coupling optical component. Reference numeral 12 is a chip carrier plate (first insulation plate) on which the semiconductor laser diode device 11 is mounted. To radiate heat generated in the semiconductor laser diode device 11 from the bottom side, the chip carrier plate 12 is made thinner than the other insulation plate (second insulation plate) 14. The packaging layout is designed so as to make the width of the chip carrier plate 12 in the directions of the electrical signal and optical signal as short as possible since this can not only minimize the inductance between the semiconductor laser device 11 and the driver IC 13 but also make the semiconductor laser 11 closer to the coupling lens 17. The chip carrier plate 12 and the coupling lens 17 are located and mounted on a metal seat 35 made of Cu, W or the like. The metal seat 35 and the driver IC chip 13 are located and mounted on the terrace 36.

Reference numeral 14 is a insulation plate (second insulation plate) on which a thin-film inductor element 15 and a thin-film resistor element 16 are formed. These are connected in parallel and their one end pad 30 is electrically connected via a bonding wire 23 to an electrode 12a on which the semiconductor laser device 11 is mounted. The bias current is supplied through this path. The insulation plate 14 must be made thicker than the chip carrier plate 12 in order to lower the permittivity. Therefore, the insulation plate 14 is made as a discrete plate separated from the chip carrier plate 12 and placed on, for example, a side of the chip carrier plate 12 or driver IC chip 13 (distant in a plane perpendicular to the directions of the electrical signal and optical signal). Note that the insulation plate 14 is also mounted on a terrace 14 or a ground.

Reference numeral 18 is an input signal line and 23, 24, 25, 26 and 27 are bonding wires. The bonding wire 23 connects the electrode 12a with the pad 30. The bonding wire 24 connects the semiconductor laser 11 with a ground electrode 12b. The bonding wire 25 connects the other end pad 32 of the thin-film resistor element 16 with the power supply terminal of the driver IC 13. The bonding wire 26 connects the collector terminal of a transistor Q2 in the driver IC 13 with the semiconductor laser diode device 11. The bonding wire 27 connects the ground electrode 12b with a terminal that is connected to the collector of a transistor Q1 in the driver IC 13 via a resistor. The casing 19 of the optical transmission module is made of ceramics to hermetically seal the inside thereof. A laser light emission area 20 is formed as part of the casing 19.

To improve thermal radiation from the semiconductor laser device 11, it is preferable that the chip carrier plate 12 is made of aluminum nitride superior in thermal conductivity. The insulation plate 14 is made of relatively low cost alumina although it is preferable to use a still higher permittivity glass epoxy in order to further reduce grounding parasitic capacitances 21 and 22.

Then, the circuit configuration is described with reference to FIG. 2. A modulated signal current amplified by the driver IC 13 is output to both ends of the semiconductor laser device 11 from the transistors Q1 and Q2 in the output stage via the bonding wires 24, 26 and 27. A bias drive current Ibias generated by an internal circuit of the driver IC 13 is supplied to the semiconductor laser device 13 via the bonding wires 24, 23 and 25 and via the thin-film inductor element (e.g., a thin-film spiral inductor element) 15 and thin-film resistor element 16 which are connected in parallel. The capacitances 21 and 22 are grounding parasitic capacitances which appear respectively between the ground and one end pad of the thin-film inductor element 15 and thin-film resistor element 16 formed on the insulation plate 14 and between the ground and the other end pad.

Figure 4:
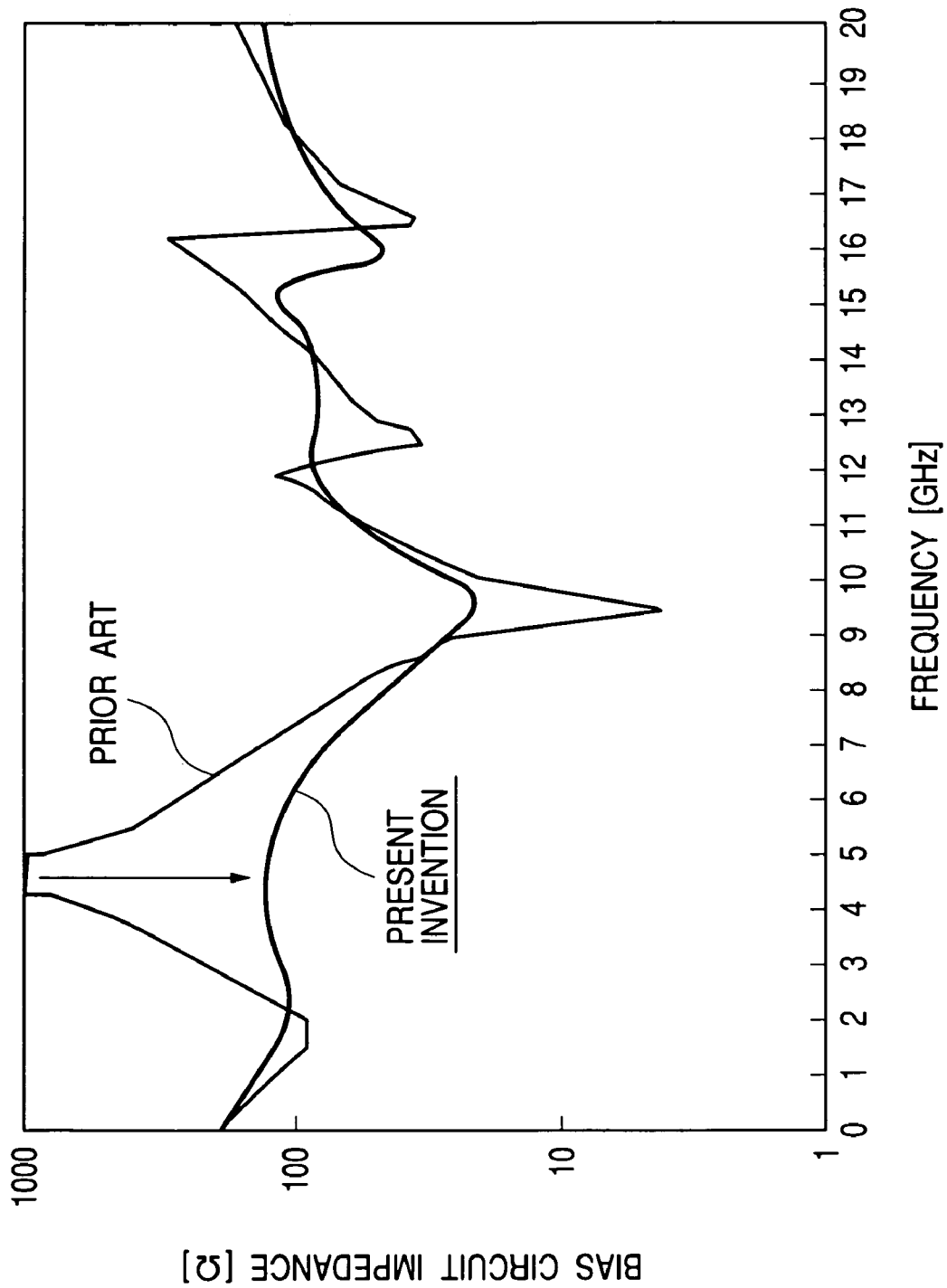
FIG. 4 is a graph for explaining the effect of the present invention represented by the relation between the frequency [GHz] and the bias circuit impedance [Ω]

According to the configuration of this embodiment, if the thin-film inductor element 15, thin film resistor element 16 and bonding wire 23 are respectively set to, for example, some 10 nH, 225 Ω and 1.4 nH, about 0.15 pF is added as the parasitic capacitance 15 to the layout. In this case, since the impedance of the bias circuit, viewed from the semiconductor laser device 11 via the bonding wire 23, is as shown in FIG. 4, it is realized that (1) the frequency at which the impedance shows a minimum, or the resonant frequency of the circuit composed of the bonding wire 23 and the parasitic capacitance 21 is 9.6 GHz beyond 8 GHz and (2) the impedance peak at the resonant frequency of the circuit composed of the thin film inductor element 15 and the parasitic capacitance 21 is suppressed to eliminate the influence of the resonance.

As described so far, by designing the packaging layout so as to make the width of the chip carrier plate 12 as small as possible in the directions of the electrical signal and optical signal and placing the driver IC 13 to drive the semiconductor laser device 11, the chip carrier plate (first insulation plate) 12 having the semiconductor laser device 11 thereon and the coupling optical component 17 in this order in the directions of the electrical signal and optical signal, it is possible to minimize the distance between the semiconductor laser device 11 and the driver IC chip 13 and therefore minimize the inductance introduced by the bonding wires (or ribbons) 26 and 27. In addition, since the width of the chip carrier plate 12 in the directions of the electrical signal and optical signal is minimized, it is possible to place the coupling optical component 17 nearer to the semiconductor laser device 11 and therefore minimize the size of the coupling optical component 17 (e.g., a coupling lens).

Figure 3:
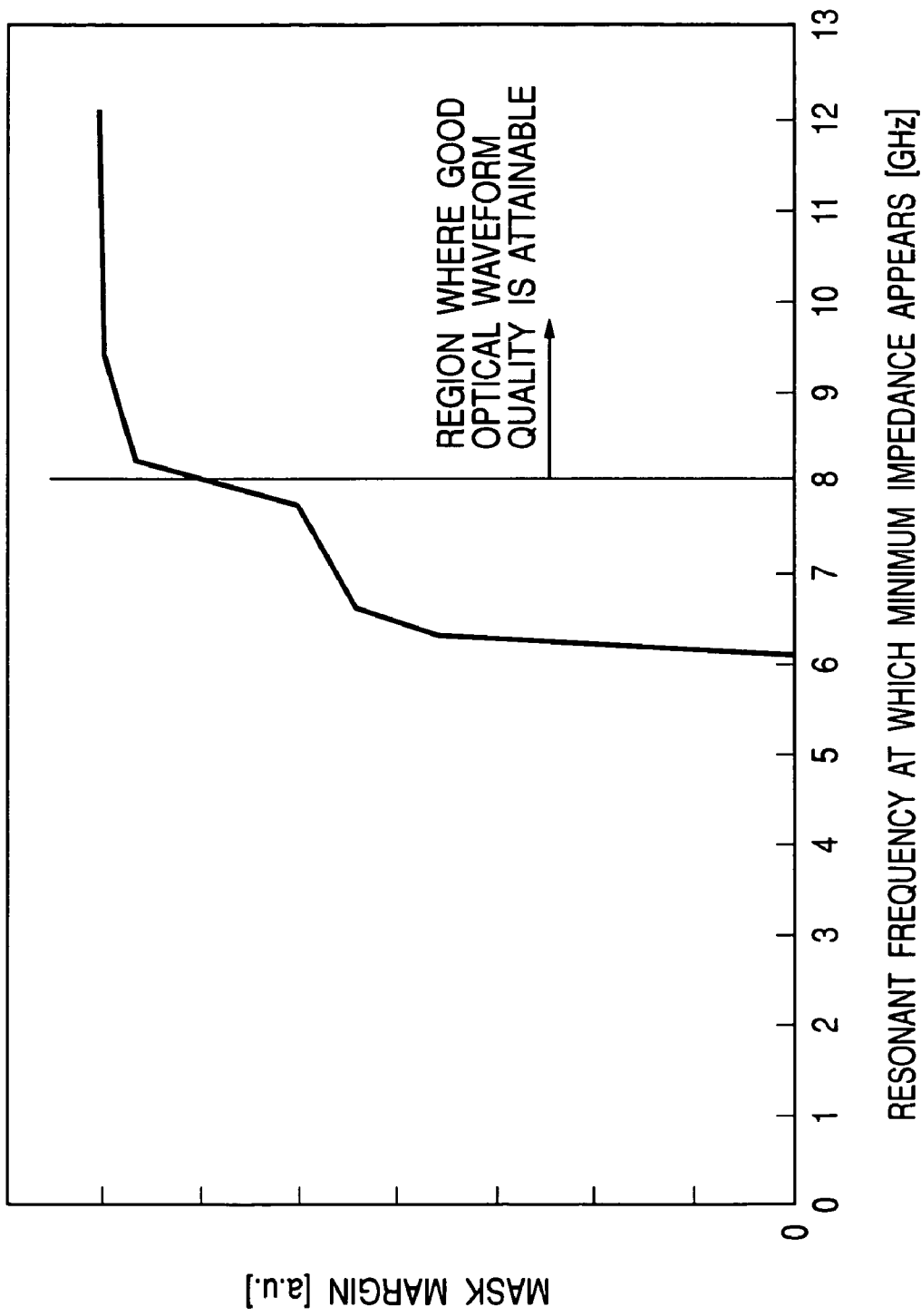
FIG. 3 is a graph for explaining the principle of the present invention which concerns the relation between the resonant frequency [GHz] causing a minimum impedance and the amount of mask margin [a.u.]

In addition, since the insulation plate (second insulation plate) 14 having the thin film inductance element 15 and thin film resistor element 16 formed thereon is placed adjacent to the first insulation plate 12 and the first insulation plate 12 and the second insulation plate 14 are connected via the bonding wire 23, it is possible to reduce the capacitances 21 and 22 parasitic respectively to the two opposite end pads 30 and 32 of the thin film inductor element 15 and thin film resistor element 16. Accordingly, the impedance of the bias circuit (23, 15, 16, 21, 22 and 25) viewed from the semiconductor laser device 11 can be designed so that its resonant frequency at which the bias circuit has a minimum impedance is not less than 8 GHz, as shown in FIG. 4. As a result, we could attain a good waveform as shown in FIG. 3 in which the amount of mask margin indicating the quality of the optical waveform is substantially maximized. According to our study, the resonant frequency can remain in that region unless the length of the bonding wire 23 exceeds 1 mm.

Figure 5:
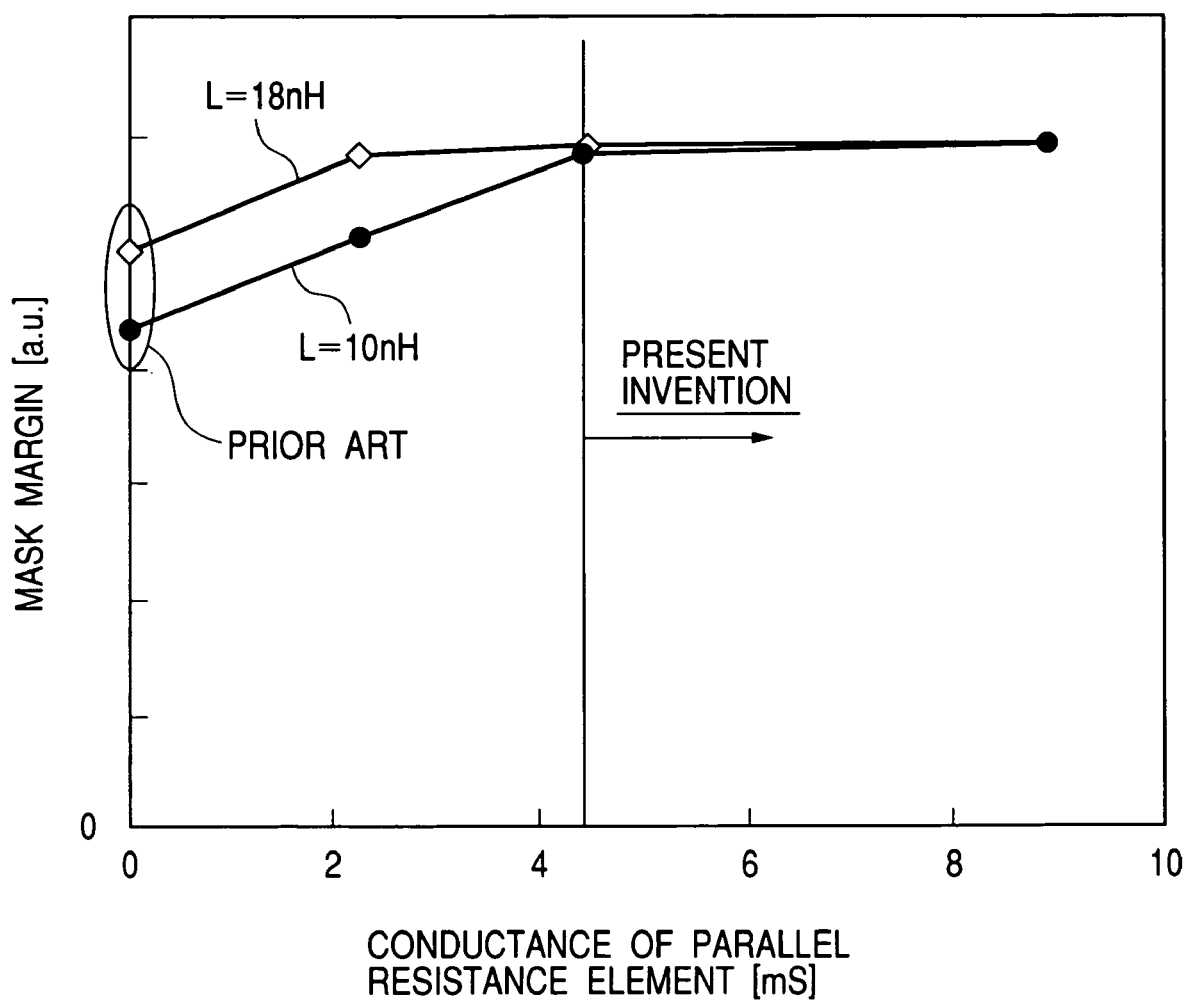
FIG. 5 is a graph for explaining the effect of the present invention represented by the relation between the conductance [mS] of the parallel resistor element and the amount of mask margin [a.u.]
Figure 6A:
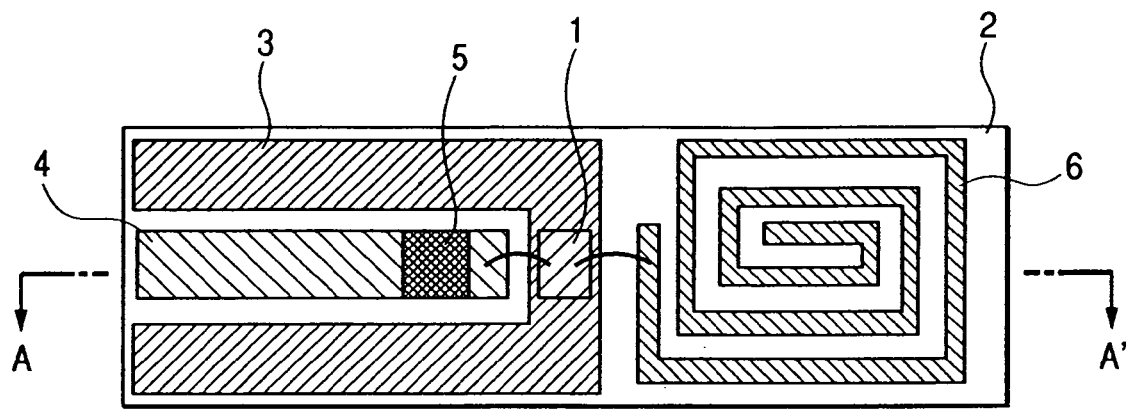
FIG. 6A is its top view and FIG. 6B is its front view.
Figure 6B:
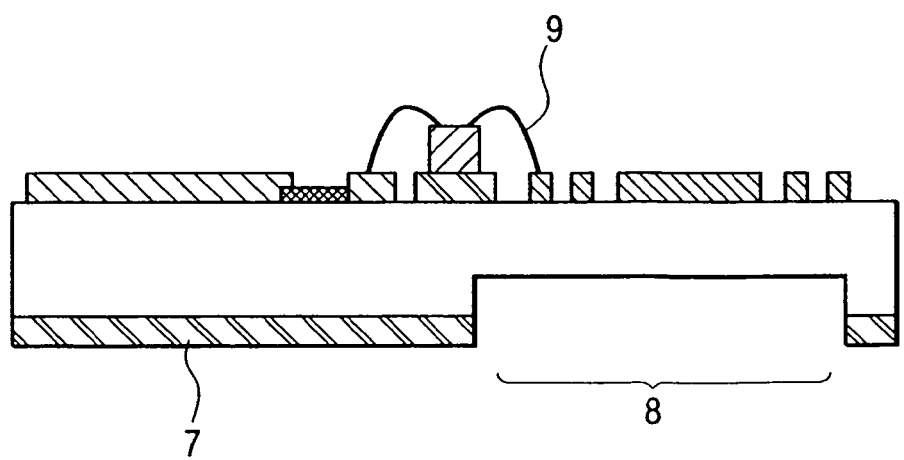

In addition, since the bias current Ibias is supplied to the semiconductor laser device 11 via the thin film inductor element 15 and thin film resistor element 16 connected in parallel, the resonance of the circuit containing the capacitance 21 parasitic to the thin film inductor and its self-inductance can be minimized by the resistor element 16 connected in parallel. Accordingly, as shown in FIG. 4, the pertinent impedance peak of the bias circuit is remarkably minimized as compared with a sharp peak (indicated by a thin line) around 4 GHz in the corresponding prior art circuit where no parallel resistor is used. As a result, the amount of mask margin which indicates the quality of the optical waveform could substantially be maximized by setting the conductance of the parallel resistor to 4.4 mS or higher (225 Ω or lower in terms of resistance) as shown in FIG. 5. As compared with the prior art module where the conductance is zero, that is, no parallel resistor element is used, the quality of the optical transmission waveform can be improved.

In addition, since the thin film inductor element 15 is formed on the second insulation plate 14 separated from the first insulation plate 12 which must be reduced in size as described earlier, it is possible to enlarge the size of the inductor element 15 and therefore increase the current capacity and decrease the series resistance.

In addition, since the semiconductor laser diode device 11 and the thin inductor element 15 are respectively formed on separate plates, it is possible to not only improve the heat radiation from the laser diode element by thinning the first insulation plate 12 but also at the same time reduce the capacitances parasitic to the inductor element by thickening the second insulation plate 14.

As described so far, according to the present invention, it is possible to attain an optical transmission module structure capable of maintaining the quality of the transmission waveform and operating at lower power.

In addition, according to the present invention, it is possible to implement an optical transmission module suited ideally for use in optical transmission transceivers.

What is claimed is:

1. An optical transmission module comprising:
  a driver IC chip which drives a semiconductor laser device;
  a first insulation plate which is placed adjacent to the driver IC chip and has the semiconductor laser device mounted thereon;
  a coupling optical component which is place adjacent to the first insulation plate and is used to emit an optical signal from the semiconductor laser device into an optical fiber; and
  a second insulation plate which is placed adjacent to the first insulation plate and has a thin film inductor element and a thin film resistor element mounted thereon;
  wherein the driver IC chip, the first insulation plate, the coupling optical component, and the second insulation plate are contained in a package; and
  wherein the first insulation plate and the second insulation plate are connected by using a bonding wire or ribbon so that a bias current is supplied to the semiconductor laser device via the thin film inductor element and the thin film resistor element which are connected in parallel.

2. An optical transmission module according to claim 1 wherein a terminal of the driver IC chip is connected with an electrode on the first insulation plate by using a bonding wire or ribbon.

3. An optical transmission module according to claim 2 wherein the driver IC chip is a current drive type.

4. An optical transmission module according to claim 1 wherein a resonant frequency in a resonant circuit composed of grounding capacitance of the thin film inductor element on the second insulation plate and an inductance of the bonding wire is not lower than 8 GHz.

5. An optical transmission module according to claim 1 wherein the driver IC chip is a current drive type.

6. An optical transmission module wherein a bias current is supplied to a semiconductor laser device via a thin film inductor element and a thin film resistor element which are connected in parallel, wherein a first insulation plate having the semiconductor laser device mounted thereon and a second insulation plate having the thin film inductor element and the thin film resistor element formed thereon are respectively formed as separate insulation plates and an electrode formed on the first insulation plate is connected via a bonding wire or ribbon with one end pad of the thin film inductor element and the thin film resistor element which are connected in parallel.

7. An optical transmission module according to claim 6 wherein a resonant frequency in a resonant circuit composed of grounding capacitance of the thin film inductor element on the second insulation plate and an inductance of the bonding wire is not lower than 8 GHz.

8. An optical transmission module according to claim 6 wherein a driver IC chip to drive the semiconductor laser device is placed adjacent to the first insulation plate and a terminal of the driver IC chip is connected with an electrode on the first insulation plate by using bonding a wire or ribbon.

9. An optical transmission module according to claim 8 wherein the driver IC chip is a current drive type.

* * * * *